United States Patent [19]

Saito et al.

[11] Patent Number: 5,522,727

[45] Date of Patent: Jun. 4, 1996

[54] ELECTRICAL ANGLE CONNECTOR OF A PRINTED CIRCUIT BOARD TYPE HAVING A PLURALITY OF CONNECTING CONDUCTIVE STRIPS OF A COMMON LENGTH

[75] Inventors: Kazuki Saito; Takenori Kudo; Shoji Umesato; Masahiro Yamada, all of Tokyo, Japan

[73] Assignees: Japan Aviation Electronics Industry, Limited; NEC Corporation, both of Japan

[21] Appl. No.: 307,199

[22] Filed: Sep. 16, 1994

[30] Foreign Application Priority Data

Sep. 17, 1993 [JP] Japan .................................. 5-231174

[51] Int. Cl.⁶ .................................................. H01R 23/70
[52] U.S. Cl. .................................................. 439/65; 439/79
[58] Field of Search ................................. 439/79, 55, 65, 439/80

[56] References Cited

U.S. PATENT DOCUMENTS

| | | | |
|---|---|---|---|
| 2,844,807 | 7/1958 | McMulkin | 439/79 |
| 3,028,573 | 4/1962 | Stoehr | 439/65 |
| 3,290,637 | 12/1966 | Yuska | 439/79 |
| 3,406,246 | 10/1968 | Davidson et al. . | |
| 3,601,772 | 8/1971 | Mancini . | |
| 3,876,822 | 4/1975 | Davy et al. . | |
| 4,338,717 | 7/1982 | Damon | 439/79 |
| 4,571,014 | 2/1986 | Robin et al. . | |
| 4,705,332 | 11/1987 | Sadigh-Behzadi . | |
| 5,167,531 | 12/1992 | Broschard, III et al. | 439/607 |
| 5,173,056 | 12/1992 | Kniese et al. | 439/79 |

FOREIGN PATENT DOCUMENTS

| | | | |
|---|---|---|---|
| 1223913 | 9/1966 | Germany | 439/79 |
| 270184 | 7/1989 | Germany | 439/79 |
| WO94/07284 | 3/1994 | WIPO . | |

*Primary Examiner*—Gary F. Paumen
*Attorney, Agent, or Firm*—Laff, Whitesel, Conte & Saret, Ltd.

[57] ABSTRACT

A right-angle electrical connector comprising a plurality of contacts supported on an insulator body, the contacts having a length equal to one another and having opposite ends projecting in different directions normal to each other and coming into contact with first and second connection objects, respectively, to be electrically connected by the connector. Each of the contacts comprises two portions extending in the different directions. The ratio of two portions of each one of contacts is different from that of the different one of contacts. In order to avoid production of various contacts which are different from one another in shape and dimension, the connector comprises a main element of an insulator substrate and conductive strip lines formed thereon, and contact elements like one another fixed to the insulator substrate to project from, and in directions normal to, adjacent side edges of the insulator substrate, respectively. The conductive strip lines have a length equal to each other and first and second ends near the adjacent side edges and are electrically connected to the contact elements. The contact elements are used for making connection with the first and the second connection objects.

7 Claims, 5 Drawing Sheets

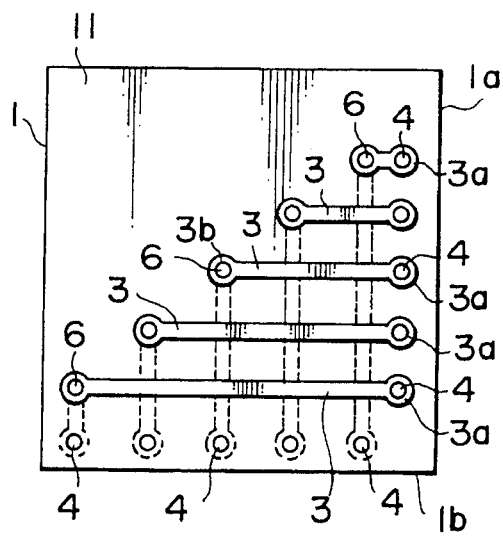
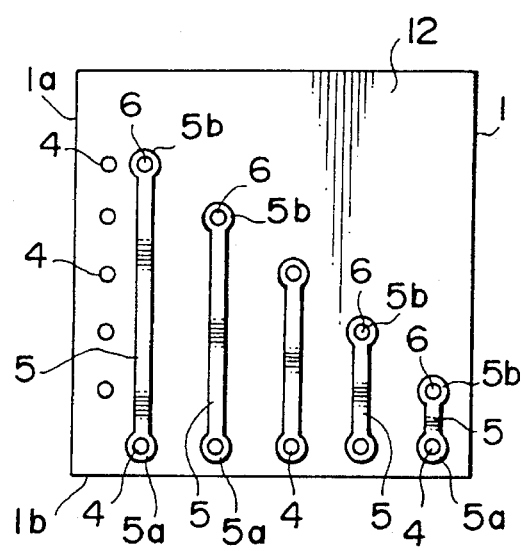
FIG. 2　　　　　FIG. 3
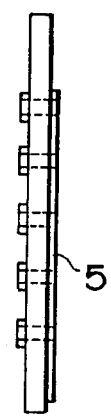
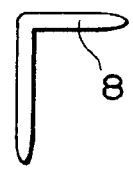
FIG. 4　　　　　FIG. 5

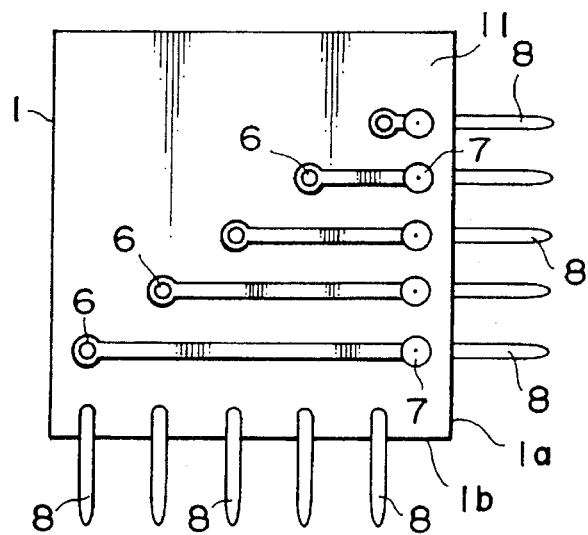 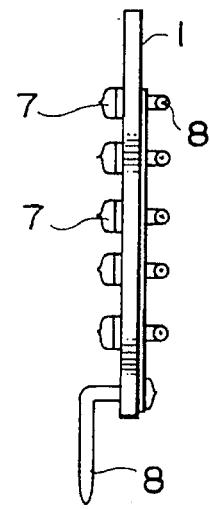
FIG. 6　　　　　　FIG. 7
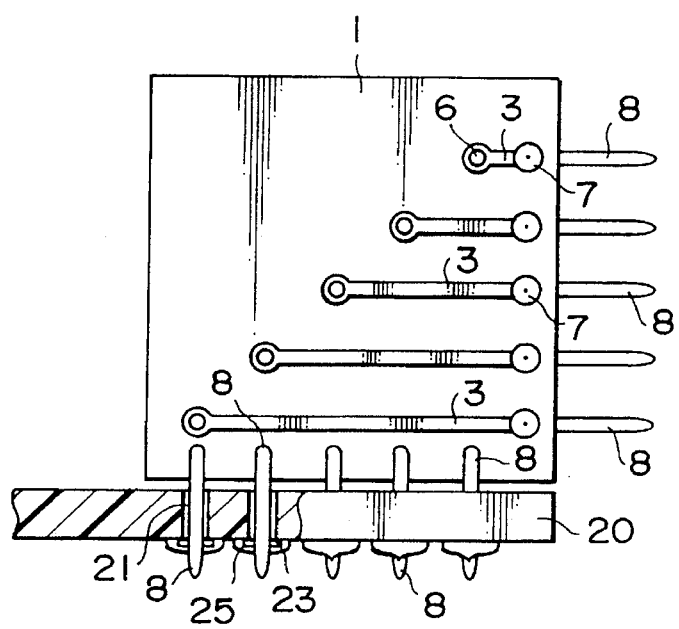 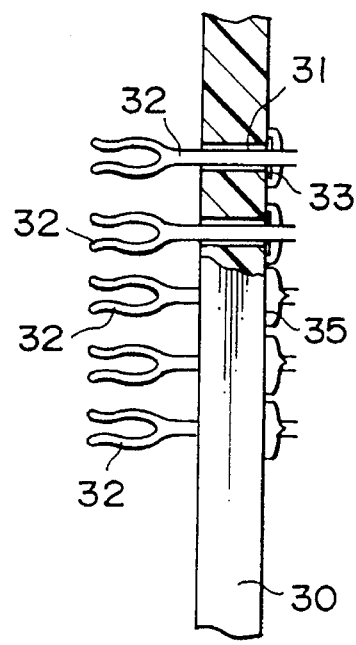
FIG. 8

ELECTRICAL ANGLE CONNECTOR OF A PRINTED CIRCUIT BOARD TYPE HAVING A PLURALITY OF CONNECTING CONDUCTIVE STRIPS OF A COMMON LENGTH

BACKGROUND OF THE INVENTION

The present invention relates to an electrical connector and, in particular, to an angle connector, typically a right-angle printed circuit board connector having a plurality of contact portions which are substantially equal to each other in the length.

U.S. Pat. No. 5,173,056 by Kniese et al discloses a right-angle circuit board connector. The connector has a housing mounted on a printed circuit board and a plurality of rows of contacts extending from the housing, each row being arranged one above the other. The printed circuit board has a plurality of plated through holes laid out in a matrix of rows and columns with predetermined grid spacing. The contacts of each of contact rows extend to holes of corresponding one of the hole rows. That is, the length of the portions of contacts extending from the connector housing of respective rows is chosen approximately in inverse ratio to the length of the portions of the contacts bent towards the circuit board. As a result, approximately equal overall lengths are obtained for all connector contacts and extending from the housing and consequently, the delay times of signals transmitted via each individual contact are also approximately the same.

A right-angle connector having a similar construction is also disclosed in U.S. Pat. No. 5,167,531 by Broschard, III et al.

In the known right angle connectors, contacts of different rows are different from each other in the shape. Therefore, contacts having different shapes must be prepared in production and for maintenance of the connectors. This makes production and management of contacts complicated and makes the cost of contacts high.

Further, the connector housing has a predetermined length for accommodating the number of columns. If the columns are different in number, various connector housings must be prepared to have different lengths. This also makes production of the connector complicated. In order to resolve the problem, the connector housing can be prepared for a single column. A number of connector housings are used for the number of columns. Although this resolves the problem of the connector housing, the problem of the contacts are not yet resolved.

SUMMARY OF THE INVENTION

Accordingly, it is an object of the present invention to provide an angle connector which requires no production of various shape of contacts to thereby enable easy production and management of contacts and reduction of cost of the contacts and the connector.

The present invention is applicable to an electrical angle connector for use in electrical connection of a set of first conductive elements with a set of second conductive elements, respectively, the first conductive elements arranged with a space left between adjacent ones in a first line extending on a first connection object, and the second conductive elements being arranged with a space left between adjacent ones in a second line extending on a second connection object. The connector according to the present invention comprises: an insulator substrate having a first linear side edge and a second linear side edge which extend in different directions to intersect with a predetermined angle therebetween; a first set of contact elements mechanically fixed to the insulator substrate along the first linear side edge with a space left between adjacent ones corresponding to the first conductive elements and outwardly projecting from the first linear side edge in a direction normal thereto for making an electrical connection with the first conductive elements, respectively; a second set of contact elements mechanically fixed to the insulator substrate along the second linear side edge with a space left between adjacent ones corresponding to the second conductive elements and outwardly projecting from the second linear side edge in a direction normal thereto for making an electrical connection with the second conductive elements, respectively; and a set of conductive strip lines formed on the insulator substrate to have a predetermined common length, the strip lines having first ends electrically connected to the first set of contact elements, respectively, and second ends electrically connected to the second set of contact elements, respectively.

In one aspect of the present invention, the insulator substrate has a first surface and a second surface opposite the first surface. The conductive strip lines comprises: first portions extending on the first surface in a direction parallel to the second linear side edge from the first ends to first portion ends by different lengths, respectively; second portions extending on the second surface in a direction parallel to the first linear side edge from the second ends to second portion ends by different lengths, respectively, the second portion ends being corresponding to the first portion ends; and interconnecting conductive strips extending from the first surface to the second surface through the insulator substrate and mechanically and electrically interconnecting the first portion ends and the second portion ends, respectively.

According to another aspect of the present invention, the predetermined angle is 90 degree so that the electrical angle connector is a right angle connector.

According to the another aspect of the present invention, the electrical angle connector further comprises a first and a second insulator layer overlying the first and the second surfaces of the insulator substrate.

The first and the second insulator layers are provided with metal layers formed on outside surfaces thereof as ground patterns. The ground patterns should be formed to be disconnected from the conductive strip lines and the contact elements.

The electrical angle connector further comprises ground conductive means extending through the insulator substrate, and the first and the second insulator layers and connecting the first ground pattern with the second ground pattern. The ground conductive means are formed as through holes.

The connector further comprises ground contact elements similar to the first and second contact elements and fixed to and electrically connected to the through holes for making electrical connection with ground pattern portions formed on the first and the second connection objects.

BRIEF DESCRIPTION OF THE DRAWINGS

FIG. 2 is a left side view of a main element of a right-angle connector according to an embodiment of the present invention;

FIG. 3 is a right side view of the main element of FIG. 2;

FIG. 4 is a front view of the main element of FIG. 2;

FIG. 5 is a side view of one of contact elements which are used together with the main element to form the connector;

FIG. 6 is a left side view of the connector having the main element and the contact elements fixed to the main element;

FIG. 7 is a front view of the connector of FIG. 6;

FIG. 8 is a left side view illustrating a condition where the connector of FIGS. 6 and 7 is mounted on a daughter board but before being connected to a back plane;

DESCRIPTION OF PREFERRED EMBODIMENTS

Prior to description of preferred embodiments of the present invention, the known right-angle connector disclosed in U.S. Pat. No. 5,173,056 is described so as to help the better understanding of the present invention.

Figure 1:
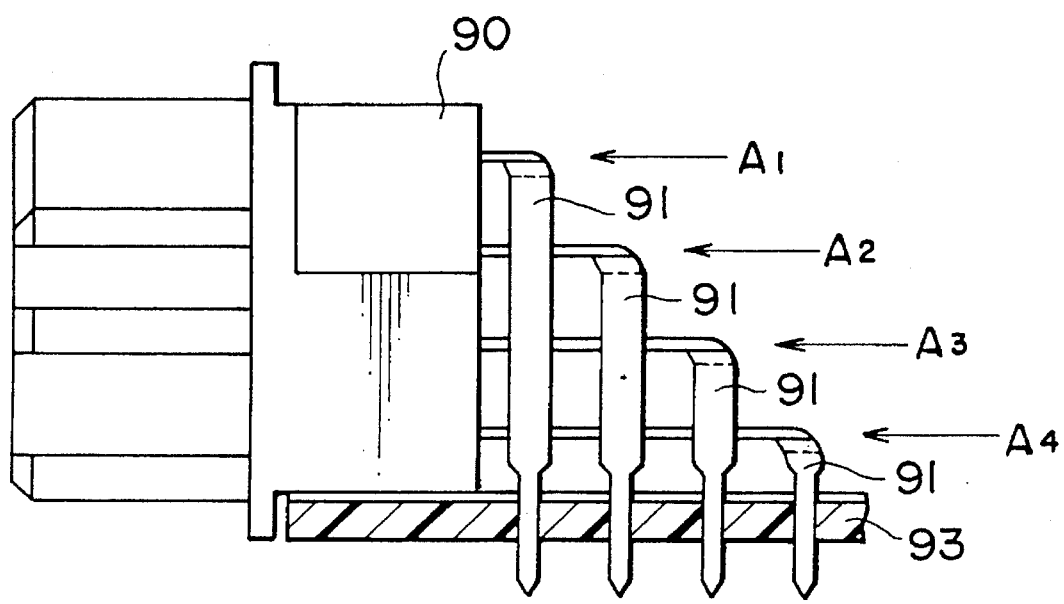
FIG. 1 is a partial schematic side view of a known right-angle connector.

Referring to FIG. 1, the known right-angle circuit board connector has a housing 90 of insulator mounted on an edge region of a printed circuit board 93. Extending from the insulator housing 90 are four rows A1 to A4 of connector contacts 91, each row arranged one above the other. The printed circuit board 93 has a plurality of plated through holes laid out in a matrix of rows and columns with predetermined grid spacing. The contacts 91 of the uppermost row A1 extend to the row of holes located closest to the connector housing 90, the contacts of the second and third rows A2 and A3 extend to the next succeeding second and third rows of holes further away from the housing 90, and the lowermost row A4 of contacts 91 extend to the holes which are spaced furthest away from the connector housing 90.

Accordingly, the length of the portions of contacts 91 extending from the connector housing 90 of the first, second, third, and fourth rows A1, A2, A3 and A4, respectively, is chosen approximately in inverse ratio to the length of the portions of the contacts bent towards the circuit board 93. As a result, approximately equal overall lengths are obtained for all connector contacts and extending from the housing 90 and consequently, the delay times of signal transmitted via each individual contact 4 are also approximately the same.

However, the connector has disadvantages as described in the preamble.

Referring to FIGS. 2–9, description will be made as to a right-angle connector according to an embodiment of the present invention.

The connector comprises a main element shown in FIGS. 2 through 4 and contact elements one of which is shown in FIG. 5.

Referring to FIGS. 2 through 4, the main element is a type of a printed circuit board, and comprises an insulator substrate 1 having a first linear side edge 1a and a second linear side edge 1b which extend in different directions to intersect with a predetermined angle therebetween. Since the embodiment is a right-angle type, the predetermined angle is 90 degree.

A set of conductive strip lines 3–5 formed on the insulator substrate 1 and have a predetermined common length. The strip lines 3–5 have first ends 3a on the substrate 1 along the first linear side edge 1a and second ends 5a on the substrate 1 along the second linear side edge 1b.

In detail, the insulator substrate 1 has a first surface 11 and a second surface 12 opposite the first surface 11. The conductive strip lines 3–5 comprises first portions 3, as shown in FIG. 2, extending on the first surface 11 in a direction parallel to the second linear side edge 1b from the first ends 3a to first portion ends 3b by different lengths, respectively. The conductive strip lines 2–5 further comprises second portions 5, as shown in FIG. 3, extending on the second surface 12 in a direction parallel to the first linear side edge 1a from the second ends 5a to second portion ends 5b by different lengths, respectively. The second portion ends 5b are corresponding to the first portion ends 3b. Through holes 6 are formed to extend from the first surface 11 to the second surface 12 through the insulator substrate 1. The through holes 6 have metal layers plated on their inner surfaces to electrically interconnect the first portion ends 3b and the second portion ends 5b to electrically connect the first portions 3 with the second portions 5 of conductive strips, respectively. The conductive strip lines, each comprises the first portion 3 and the second portion 5 connected by the through hole 6, are substantially equal to one another in the total length.

Through holes 4 are formed in the first ends 3a and the second ends 5a and extend through the insulator substrate 1 from the first surface 11 to the second surface 12.

Referring to FIG. 5, the contact element 8 is shown to have an L-shaped pin contact element.

Referring to FIGS. 6 and 7, a first set of contact elements 8 are mechanically fixed to the insulator substrate 1 along the first linear side edge 1a and outwardly projecting from the first linear side edge 1a in a direction normal thereto. A second set of contact elements 8 are also mechanically fixed to the insulator substrate 1 along the second linear side edge 1b and outwardly project from the second linear side edge 1b in a direction normal thereto.

In detail, a one leg portion of each of the L-shaped pin contact elements 8 is inserted into each of the through holes 4 of the first ends 3a and the second ends 5a and is fixed to each of the first and second ends by soldering shown at 7 in the figures.

Figure 9:
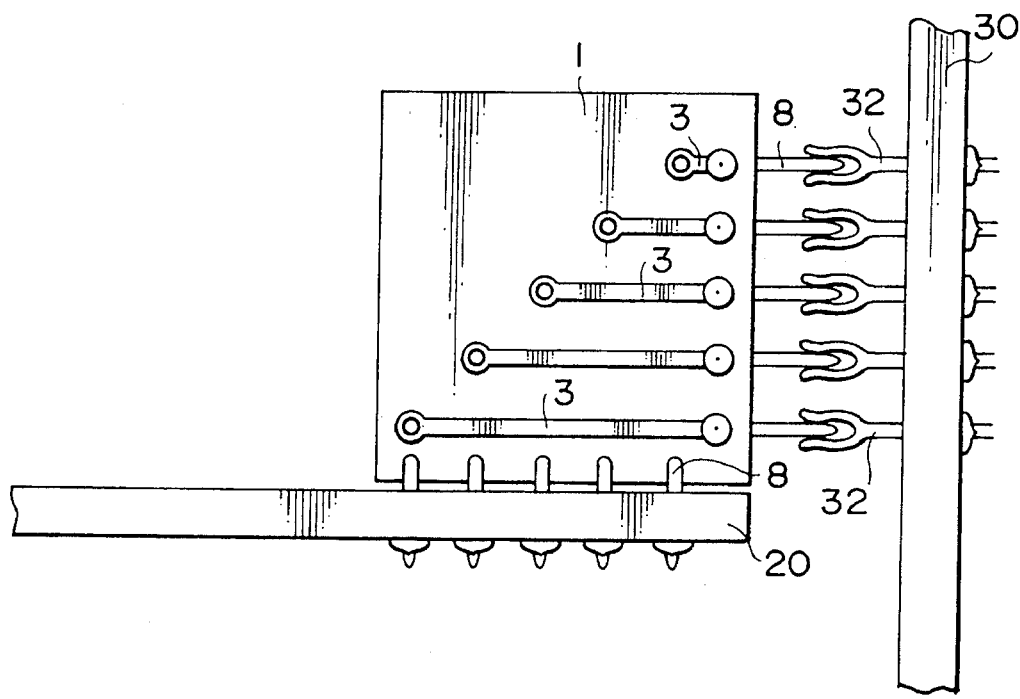
FIG. 9 is a left side view illustrating another condition where the connector of FIGS. 6 and 7 is mounted on the daughter board and is connected to the back plane.

The completed connector shown in FIGS. 6 and 7 are used as shown in FIGS. 8 and 9.

Referring to FIG. 8, the connector is mounted on and mechanically and electrically connected to a daughter board 20. The daughter board 20 is a printed circuit board which has a set of through holes 21 at land portions 23 of conductive patterns formed and arranged with a space left between adjacent ones in an linear line on the daughter board 20. The second set of contact elements 8 are also arranged with a space left between adjacent ones corresponding to the land portions 23. The second set of contact elements 8 are inserted into through holes 21 in the daughter board 20 and fixed to the land portions 23 by soldering shown at 25 in the figure and are thereby electrically and mechanically connected to the land portions 23.

The first set of contact elements 8 are electrically connected with a back plane 30 to be electrically connected to the daughter board 20 through socket contacts 32. The back plane 30 is also a printed circuit board having a set of through holes 31 arranged with a space left between adjacent ones in a linear line and formed in land portions 33 of printed circuit conductive patterns on the back plate 30. The set of socket contacts 32 are inserted into the set of through holes 31 and are electrically and mechanically connected thereto by soldering shown at 35 in the figure.

The first set of the contact elements 8 are also arranged with a space left between adjacent ones corresponding to the through holes 31. The first set of the contact elements 8 are inserted into the socket contacts 32 and are electrically connected thereto. Thus, the set of land portions 33 of the back plane 30 are electrically connected to the set of land portions 23 of the daughter board 20, respectively, by the right-angle connector. The back plane 30 is located to normal to the daughter board 20.

When the back plane 30 is desired to be located with a particular angle other than the normal angle to the daughter board 20, the insulator substrate should be formed to have the first linear side edge 1a and the second linear side edge 1b which extend in directions to intersect each other with the particular angle.

Another embodiment of the present invention is shown in FIGS. 10–13.

The connector according to the present embodiment is characterized by addition of two insulator layers and ground patterns and ground pins.

Figure 10:
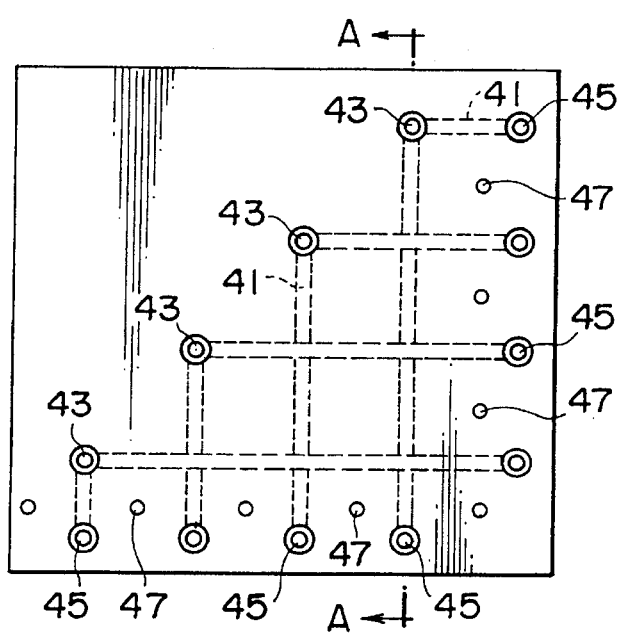
FIG. 10 is a left side view of a main element of a connector according to another embodiment of the present invention.
Figure 11:
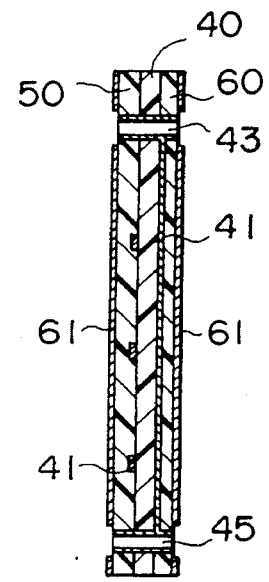
FIG. 11 is a sectional view of the main element of FIG. 10 taken along a line 11—11 shown in FIG. 10.

Referring to FIGS. 10 and 11, an insulator substrate 40, conductive strip lines 41, through holes 45 and through holes 43 are corresponding to the substrate 1, conductive strip lines 3–5, through holes 4 and through holes 6 in the embodiment of FIGS. 2–4, respectively. It is also true in the present embodiment that each of the conductive strip lines 41 comprises first and second portions formed on the first surface and the second surface opposite to the first surface, respectively, as seen in FIG. 11.

First and second insulator layers 50 and 60 overlie the first and the second surfaces of the substrate 40 including the conductive strip lines 41, respectively. The through holes 43 and 45 are formed to extend through the insulator layers 50 and 60 as well as the insulator substrate 40. Ground patterns or metal layers 61 overlie outside surfaces of the first and second insulator layers 50 and 60. A plurality of through holes 47 are formed to extend through the first insulator layer 50, the insulator substrate 40, and the second insulator layer 60 and have metal layers plated on inner surface of the through holes 47 to connect opposite ground patterns 61 with each other. The through holes 47 are arranged at positions selected near the edge regions but between adjacent through holes 45. It is important that the through holes 47 are selected the positions to be disconnected from the conductive strip lines 41 on the substrate 40.

It is also important that the ground patterns 61 are formed to be disconnected from the through holes 43 and 45.

Figure 12:
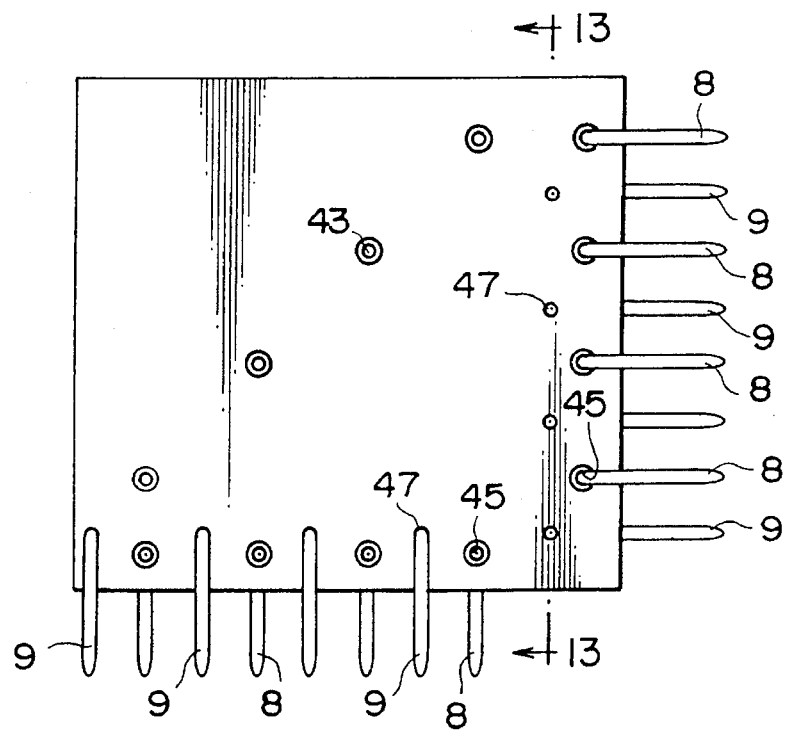
FIG. 12 is a left side view of the connector having the main element of FIGS. 10 and 11 and contact elements of FIG. 5 fixed thereto.
Figure 13:
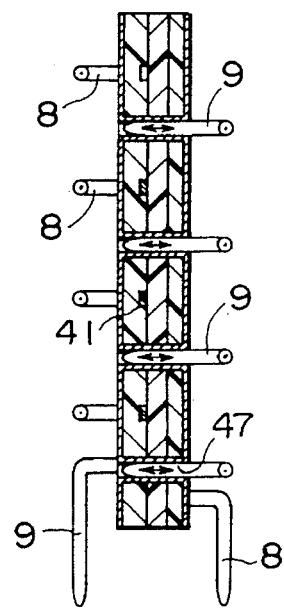
FIG. 13 is a sectional view of the connector of FIG. 12 taken along a line 13—13 shown in FIG. 12.

Referring to FIGS. 12 and 13, a first and a second sets of contact elements 8 are inserted in the through holes 45 and fixed by soldering to be electrically and mechanically connected thereto.

A set of contact elements 9 like contact elements 8 are also inserted into the though holes 47 and are connected to the ground patterns 61 by soldering.

Each of those contact elements 8 and 9 outwardly projects in the direction normal to the adjacent side edge of the insulator substrate 40. Thus, the contact elements can be connected to a daughter board and a back plane which are similar to those shown in FIGS. 8 and 9 but are additionally provided with ground patterns thereon.

In the shown embodiment, ground metal layers 61 are provided on the opposite outside surfaces. It is possible another ground patterns are formed on regions of the opposite surfaces of the substrate 40 other than the conductive strip lines 41.

According to the present invention, the connector comprises the main element of the insulator layer and conductive strip lines formed thereon and contact elements which are similar in the shape and dimension to each other. Accordingly, a plurality of main elements like one another and a plurality of contact elements like one another are only prepared to assemble connector and also stored for repairing parts without preparing various parts different in shape and dimension from one another. Accordingly, the contact element and the connector are reduced in cost.

What is claimed is:

1. An electrical angle connector for use in electrical connection of a set of first conductive elements with a set of second conductive elements, respectively, said first conductive elements being arranged with a space left between adjacent ones in a first line extending on a first connection object, and said second conductive elements being arranged with a space left between adjacent ones in a second line extending on a second connection object, which comprises:

an insulator substrate having a first linear side edge and a second linear side edge which extend in different directions to intersect with a predetermined angle therebetween;

a first set of contact elements fixed to said insulator substrate along said first linear side edge with a space left between adjacent ones corresponding to said first conductive elements and outwardly projecting from said first linear side edge in a direction normal thereto for making an electrical connection with said first conductive elements, respectively;

a second set of contact elements fixed to said insulator substrate along said second linear side edge with a space left between adjacent ones corresponding to said second conductive elements and outwardly projecting from said second linear side edge in a direction normal thereto for making an electrical connection with said second conductive elements, respectively; and a set of conductive strip lines formed on said insulator substrate to have a predetermined common length, said strip lines having first ends electrically connected to said first set of contact elements, respectively, and second ends electrically connected to said second set of contact elements, respectively.

2. An electrical angle connector as claimed in claim 1, wherein said insulator substrate has a first surface and a second surface opposite the first surface, and wherein said conductive strip lines comprises:

first portions extending on said first surface in a direction parallel to said second linear side edge from said first ends to first portion ends by different lengths, respectively;

second portions extending on said second surface in a direction parallel to said first linear side edge from said second ends to second portion ends by different lengths, respectively, said second portion ends being corresponding to said first portion ends; and interconnecting conductive strips extending from said first surface to said second surface through said insulator substrate and mechanically and electrically interconnecting said first portion ends and said second portion ends, respectively.

3. An electrical angle connector as claimed in claim 1, wherein said predetermined angle is 90 degree so that said electrical angle connector is a right angle connector.

4. An electrical angle connector as claimed in claim 1, which further comprises a first and a second insulator layer overlying said first and said second surfaces of said insulator substrate.

5. An electrical angle connector as claimed in claim 4, wherein said first and said second insulator layers are provided with first and second metal layers formed on outside surfaces thereof as first and second ground patterns, said ground patterns being formed to be disconnected from said conductive strip lines and said contact elements.

6. An electrical angle connector as claimed in claim 5, which further comprises ground conductive means extending through said insulator substrate, said first insulator layer, and said second insulator layer and connecting said first ground pattern with said second ground pattern.

7. An electrical angle connector as claimed in claim 6, wherein said ground conductive means are formed as through holes, and which further comprises ground contact elements similar to said first and second contact elements and fixed to and electrically connected to said through holes for making electrical connection with ground pattern portions formed on said first and said second connection objects.

* * * * *